Figure 1:
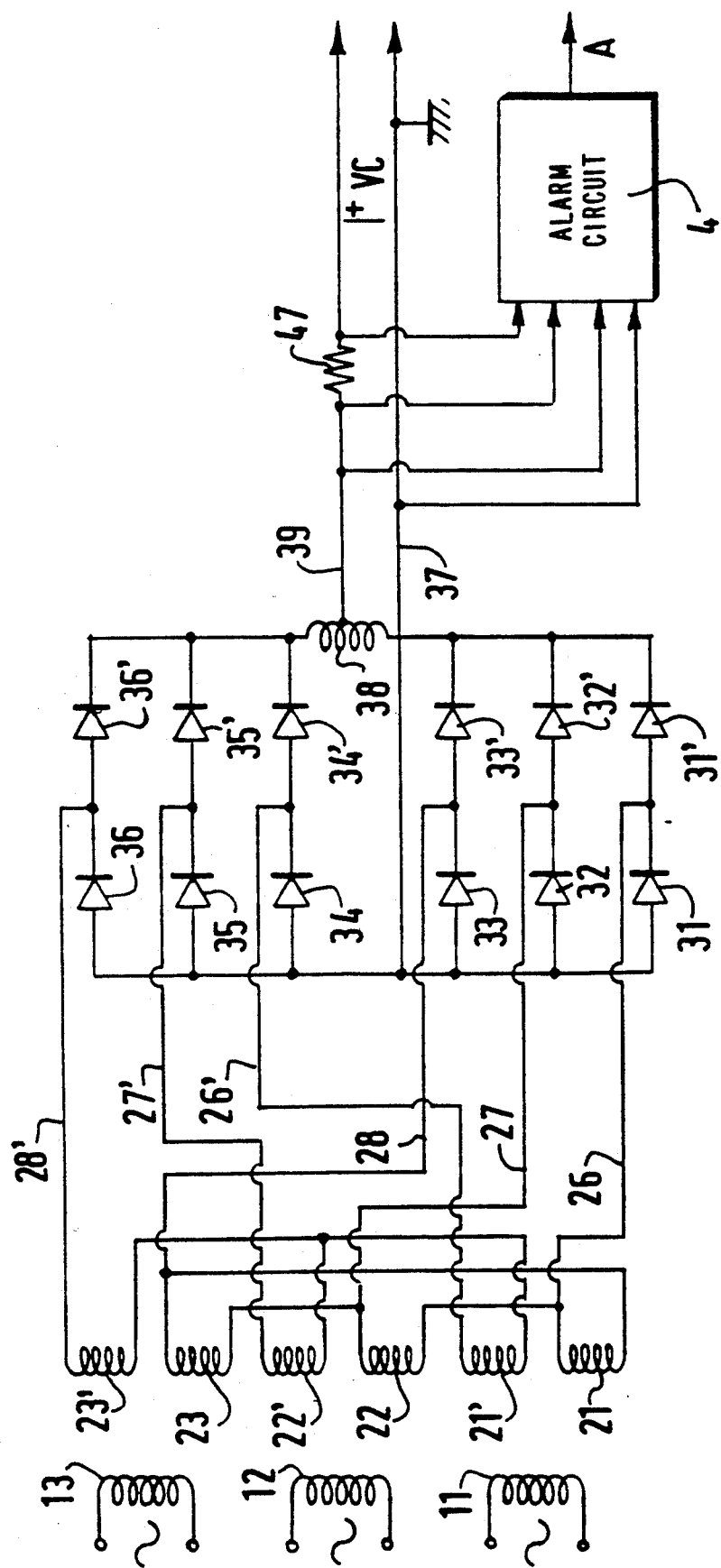

United States Patent [19]
Bocquet et al.

[11] Patent Number: 5,225,815
[45] Date of Patent: Jul. 6, 1993

[54] MONITOR FOR A POLYPHASE RECTIFIER WHICH DETECTS OPEN DIODES BY SENSING A SIGNAL BELOW A PREDETERMINED THRESHOLD

[75] Inventors: Benoît Bocquet, Paris; Joseph Hetyei, Bouffemont; Patrick Langlois, Le Blanc-Mesnil, all of France

[73] Assignee: Sextant Avionique, Cedex, France

[21] Appl. No.: 725,807

[22] Filed: Jul. 10, 1991

[30] Foreign Application Priority Data

Jul. 11, 1990 [FR] France ............... 90 08822

[51] Int. Cl.⁵ .................................. G08B 21/00
[52] U.S. Cl. ............................ 340/645; 340/652; 363/52; 324/537
[58] Field of Search ............ 340/645, 652, 529, 635; 324/158 D, 119, 500, 537 X; 307/200.1, 317.1, 321; 363/52, 53

[56] References Cited

U.S. PATENT DOCUMENTS

| 3,968,418 | 7/1976 | Kain et al. | 363/125 |
| 4,186,391 | 1/1980 | Wang et al. | 340/645 |
| 4,380,045 | 4/1983 | Ishii | 363/54 |
| 4,713,652 | 12/1987 | French et al. | 340/652 |

FOREIGN PATENT DOCUMENTS

| 0286951 | 10/1988 | European Pat. Off. . |
| 2460773 | 7/1975 | Fed. Rep. of Germany . |
| 2029138A | 3/1980 | United Kingdom . |

Primary Examiner—Jin F. Ng
Assistant Examiner—Jeffery A. Hofsass
Attorney, Agent, or Firm—Lowe, Price, LeBlanc & Becker

[57] ABSTRACT

An electronic circuit senses that at least one circuit of rectifying diodes has been opened and response initiates an alarm. To sense one of the diode circuits being opened, the electronic circuit detects a temporary crossing of a low threshold by a DC voltage supplied at the rectifier output. The circuit is particularly applicable to high-power transformer-rectifiers aboard aircraft.

3 Claims, 4 Drawing Sheets

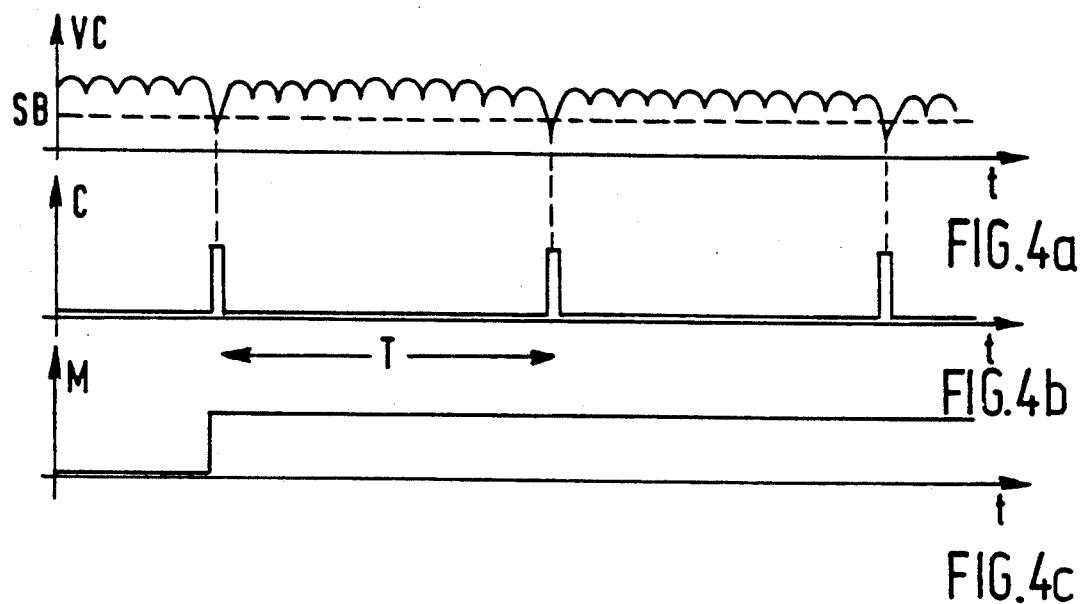
FIG.4a
FIG.4b
FIG.4c
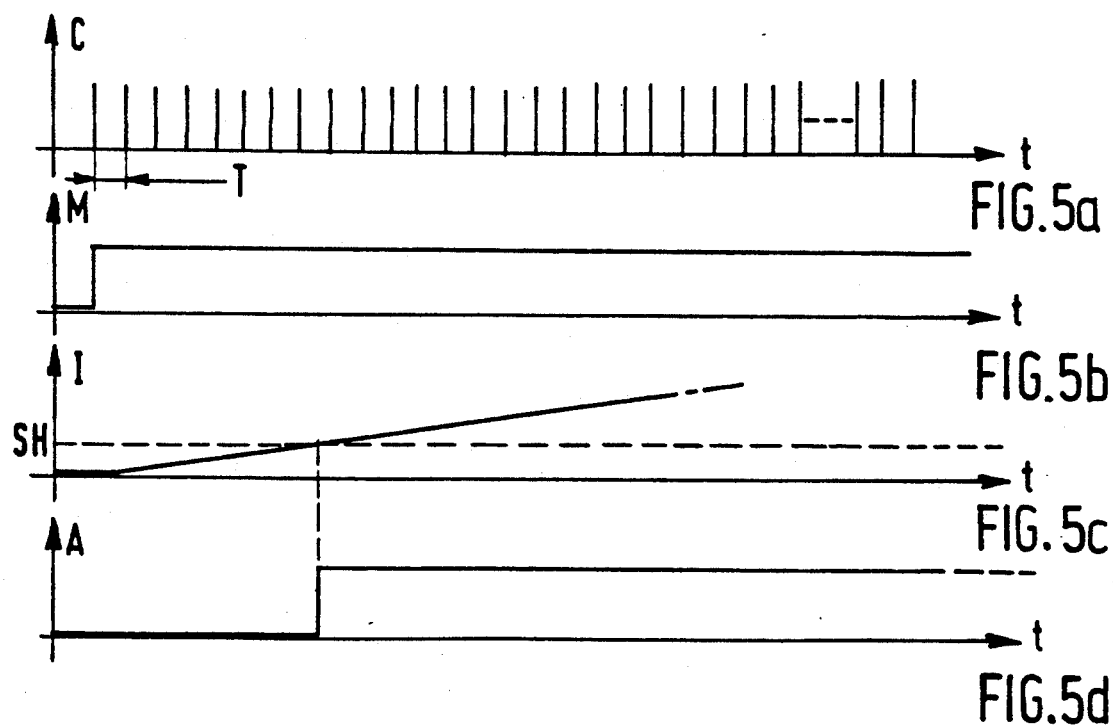
FIG.5a
FIG.5b
FIG.5c
FIG.5d

MONITOR FOR A POLYPHASE RECTIFIER WHICH DETECTS OPEN DIODES BY SENSING A SIGNAL BELOW A PREDETERMINED THRESHOLD

The object of the present invention is polyphase-rectifier monitor.

Such apparatus in particular is used with high-power transformer-rectifiers.

Such a transformer-rectifier illustratively comprises a three-phase primary, each of the three windings of this primary receiving a 400 Hz voltage. The transformer secondary comprises six windings of which three are wired in delta and three in Y. Each of these secondary windings includes a double rectifier, therefore entailing twelve diodes. The rectifier output DC voltage, used to charge batteries and/or power equipment, includes a residual ripple of low amplitude of which the frequency in the described embodiment is twelve-fold that of line applied to the primary. In the event the line frequency is 400 Hz, the ripple frequency will be 4,800 Hz.

It is important to avoid transformer-rectifier equipment failure, especially if it may lead to equipment destruction. This is especially important when the rectifier is used aboard on aircraft where any failure may entail serious consequences and where monitoring criteria are particularly rigorous.

The British patent A 2,029,138 discloses a monitor for a polyphase rectifier comprising means detecting the breaking-open of the circuit of at least one of rectifier diodes in the rectifier, in order to then issue an alarm.

Such a monitor is effective because many rectifier failures arise from breaking open one of the rectifier diodes. If there were no monitor, such failure would remain concealed because as seen from the outside, the rectifier appears to operate in problem-free manner. This is so because the sole consequence of the failure constituted by the breaking of a diode circuit is a lowering of the maximum current that the rectifier may deliver, and such lowering is not sensed when the actually delivered current is less than this value.

However the remaining diodes must deliver the current which is demanded by the load, and thereby their overloads gradually increase as other diodes are failing by their circuits breaking. This overloading may become destructive if the load current exceeds the power rating of the remaining diodes.

The above described monitor averts this problem because the user is notified by the alarm the moment a diode circuit breaks, whereby remedial steps may be taken, for instance changing the malfunctioning diode the next time the rectifier is at rest, or immediately replacing the rectifier being used by an exchange rectifier if safety constraints are particularly stringent.

However the equipment of the prior art incurs two serious drawbacks.

In the first place, this equipment is highly complex and accordingly costly and of low reliability.

In this equipment, the output voltage of the monitored rectifier bridge is compared with the output voltage of a reference bridge itself similar to the monitored bridge and therefore susceptible to the same hazards as latter. In the event of observed failure, it is impossible to know whether it arises in the monitored or in the monitoring system.

Moreover, in the prior equipment, it is impossible to match the comparison to the load of the monitored rectifier bridge.

The object of the present invention is to palliate these drawbacks.

Accordingly the object of the present invention is equipment of the above cited kind which is characterized in that said detection means sense that a low threshold has been temporarily crossed by the output voltage of said rectifier.

The equipment of the invention is especially lightweight, simple, reliable and comparatively economical, in the sense that breaking the circuit of any one diode of the rectifier bridge is sensed using a single circuit monitoring the changes in the output voltage of this rectifier. The basis of the invention is that the shape of the AC component, or ripple, at the rectifier output will change when one or more diodes are in open circuits. The moment this is the case, the ripple in the output voltage evinces descending troughs at the frequency of the primary voltage.

Advantageously control means are provided for the value of said threshold as a function of the output current of said rectifier so that the value of said low threshold decreases when the magnitude of said current increases.

In this case operation is reliable and without false alarms because the amplitude of the negative peaks of the output voltage increases with the output current. The value of the low threshold thereby is regulated automatically to assure reliable detection regardless of load.

Again advantageously a monostable circuit which is triggered when said threshold is temporarily crossed and with a time-constant larger than the period of the voltage being rectified by said rectifier.

Therefore any noise pulses lacking the frequency of the primary voltage are ignored.

Again advantageously, means integrating the value of the output signal of said monostable circuit are provided, further means comparing with a high threshold the value of the output signal of said integration means, said comparison means triggering the alarm in the event said high threshold is crossed by the output signal from said integrating means.

Thereby the protection against false alarms is further improved.

The present invention shall be elucidated further in the following description of a preferred embodiment of the monitor of the invention, which is provided in conjunction with the attached drawings.

Figure 2A:
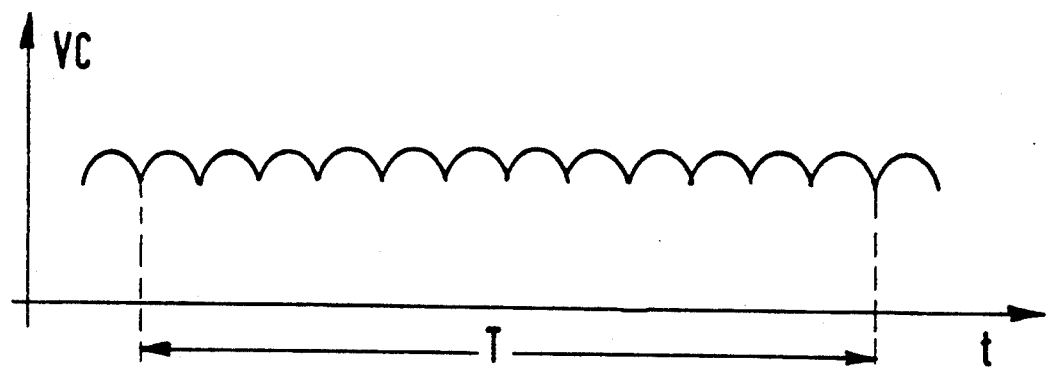
Figure 2B:
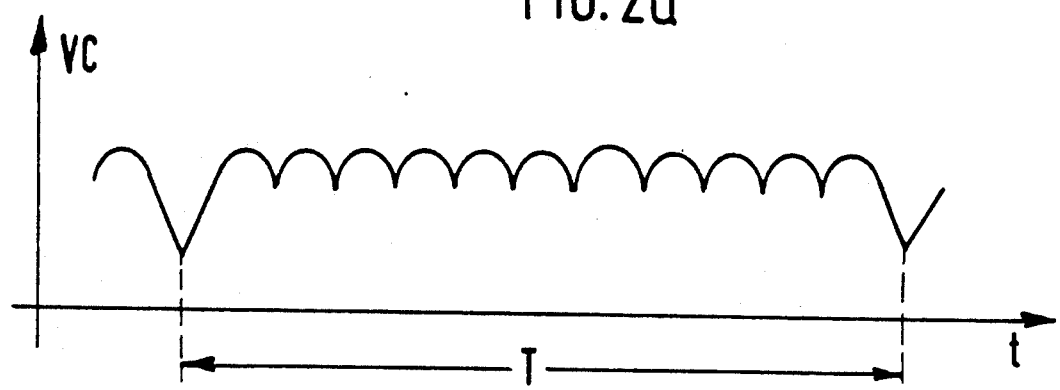
Figure 2C:
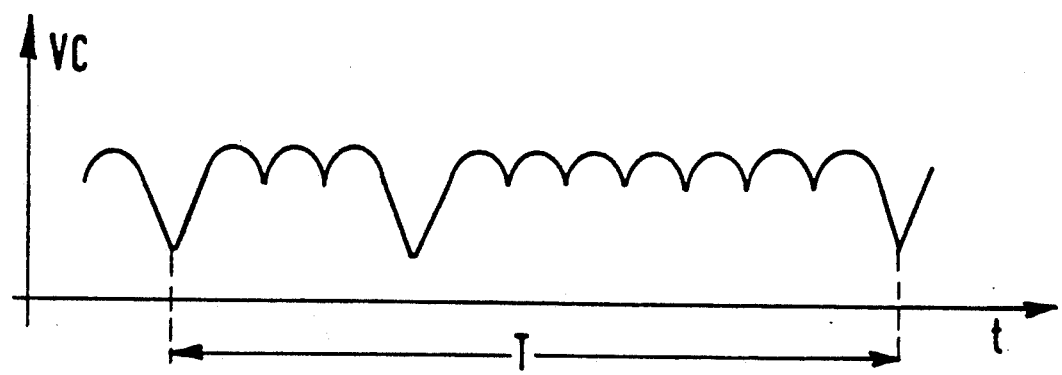
Figure 3:
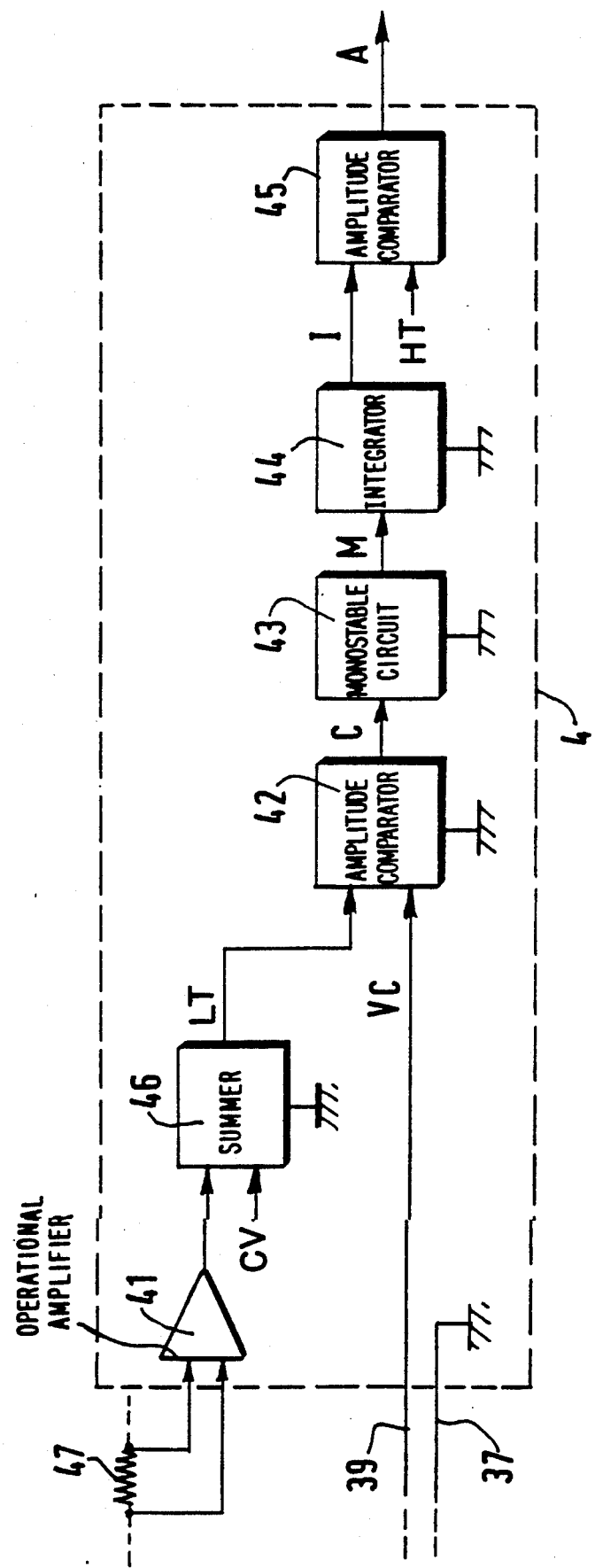

FIG. 1 is a transformer-rectifier equipped with a monitor of the invention,

FIGS. 2a, 2b, 2c show the waveshapes at the output of the transformer-rectifier of FIG. 1 in the event the number of open diode-circuits is resp. zero, one and two, FIG. 3 is a block circuit diagram of the monitor of FIG. 1, FIGS. 4a–4c show the signal time plots illustrating the operation of the equipment of FIG. 4, and FIGS. 5a–5d are the time plots of the signals of FIGS. 4 and of other, similar signals, over a time exceeding that of FIGS. 4.

FIG. 1 shows a transformer-rectifier where the transformer comprises three windings 11, 12 and 13 fed with three-phase power, here 400 Hz, that must be rectified into DC supplying for instance aircraft equipment and charging its batteries.

For that purpose six secondary windings 21, 21′, 22, 22′, 23 and 23′ coupled to the primary windings 11, 12 and 13 are provided.

The three secondary windings 21, 22 and 23 are wired in known manner in delta connection, each of the common points of these windings being resp. denoted by 26, 27 and 28.

The three secondary windings 21′, 22′ and 23′ are wired in known manner in Y-connection, each of the free ends of these windings being denoted by 26′, 27′ and 28′.

Here a rectifying bridge comprises twelve diodes 31,31′, 32,32′, 33,33′, 34,34′, 35,35′, 36 and 36′. The anodes of the diodes 31, 32, 33, 34, 35 and 36 all are connected to the same common point 37. The cathodes of the diodes 31, 32, 33, 34, 35 and 36 resp. connected to the anodes of the diodes 31′, 32′, 33′, 34′ 35′ and 36′ also are resp. connected to the points 26, 27, 28, 26′, 27′ and 28′.

The cathodes of diodes 31′, 32′ and 33′ are connected to one end of an inductor coil 38. The cathodes of the diodes 34′, 35′ and 36′0 are connected to the other end of the coil 38.

The rectified DC voltage is available across the point 37 which here is grounded and the center tap 39 of the coil 38. The point 39 is connected to the circuits which are fed the rectified DC voltage through a very low resistance 47.

An electronic circuit 4 comprises a first input to which the DC voltage is applied, a second input receiving the voltage across the terminals of the resistor 47, and an output for an alarm signal A, said output being energized when upon analysis of the ripple of the rectified DC voltage, the electronic circuit 4 has sensed at least one open diode circuit.

FIG. 2a shows the waveshape of the rectified DC voltage when the twelve diodes 31 through 36 and 31′ through 36′ are properly operating. FIG. 2a shows that the ripple in the DC voltage has a period of T/12, where T is the period of the voltage being rectified, in this case 1/400 seconds.

Accordingly each ripple peak corresponds to each diode being conducting.

FIG. 2b shows the waveshape of the rectified DC when any one, but only one of the diodes 31 through 36 and 31′ through 36′ represents an open circuit. In this case the peak in FIG. 2a that showed this diode being conducting is now replaced by descending trough. This trough repeats with a period T.

FIG. 2c shows the case of two diodes being in open circuit. In this case there are two descending troughs within each period T. If several diodes were in open circuit, there would be several descending troughs within each period T. Be it noted that the descending troughs may be considered negative if the ripple is considered centered on the DC component of the DC voltage, however in absolute values, they remain less than or equal to the value of this DC component, whereby the DC voltage never changes sign.

As explained below, the electronic circuit 4 is designed to sense the temporary crossing of a low threshold LT by the rectified DC voltage, where the LT threshold is selected to be less than the minimum value of the DC voltage of FIG. 2a while being higher than the values of the DC voltage at its descending, or negative troughs of FIGS. 2b and 2c.

Referring in this respect to FIG. 3, the electronic circuit 4 comprises initially an amplitude comparator 42 of which a first input receives the signal from the first input of the circuit 4, that is the DC voltage. The amplitude comparator 42 is provided with a second input receiving an LT voltage representing the low threshold mentioned above, and an output for a signal C.

A differential operational amplifier 4 amplifies the signal at the second input of the circuit 4, which is the voltage across the resistor 47 and reflects the current drawn by the load circuits. The output from the amplifier 41 is fed to the first input of a summer 46 of which the second input receives a constant voltage CV and of which the output emits the LT signal.

A monostable circuit 43 is triggered at its input by the signal C and emits an output signal M.

An integrator 44 integrates the signal M to emit a signal I which is compared with a HT signal representing a high threshold in an amplitude comparator 45 of which the output is the alarm signal A.

The circuit 4 described above operates as follows—in particular refer to FIGS. 4 and 5.

FIG. 4a on one hand shows the waveshape of the rectified DC voltage and on the other hand the LT (low threshold) voltage. If the DC voltage temporarily crosses the low threshold LT, which is characteristic of at least one diode circuit being open, this will be sensed by the comparator 42. As shown by FIGS. 4b and 5a, the signal C is a pulse sequence with a period T, here 400 Hz, in the case of a single diode circuit being open.

The pulses of signal C trigger the monostable circuit 43 of which the time-constant is larger than the period T, whereby, if there is permanent presence of the descending troughs of the DC voltage, the monostable circuit 43 maintains a high level of output voltage M as shown by FIGS. 4c and 5b. The integrator 44 with a time constant of several seconds delays triggering the alarm until the voltage I crosses the high threshold HT level as shown by FIGS. 5c and 5d resp. showing the waveshape of the voltage I and that of voltage A.

To assure proper operation at all possible output currents, the amplifier 41 and the summer 46 control the LT low-threshold value as a function of the output current magnitude, so that this low threshold drops when the current increases, the LT voltage being the algebraic sum of the constant voltage VC and of the output voltage of the amplifier 42 reflecting the load current, the amplitude of the descending troughs increasing with the output current.

Obviously the present invention is not restricted to the above embodiment of the invention.

Illustratively each of the diodes 31 through 36 and 31′ through 36′ may be in series with a transformer of which the secondary delivers an image of the current passing through this diode. A circuit monitoring the current waveshape is present at the output of each of the twelve transformers, an open diode-circuit being detected by the current through it being always zero whereas AC current passes through a good diode. The outputs of the twelve monitoring circuits are connected to a logic circuit which must prevent a false alarm when the output current is zero because at that time each diode current is zero even when the diodes are good. The logic circuit removes this ambiguity by suppressing the alarm when the twelve currents are zero or when the output current itself is zero.

Such an embodiment mode entailing twelve transformers, twelve monitoring circuits and an ambiguity-suppressing logic circuit however is bulkier, heavier, and comparatively costlier and less reliable than the first described embodiment mode.

Obviously the monitor of the invention is applicable beyond aircraft and beyond the delta and Y wired secondary three-phase transformer rectifier that was illustratively described. The invention is especially applicable where there are a large number of diodes, that is to any polyphase rectifier.

We claim:

1. A monitor for a polyphase rectifier, comprising detection means for detecting the opening of at least one of the rectifying diodes included in the polyphase rectifier in order to control an alarm in the event of detection of such an opening, said detection means being arranged to sense that the DC voltage at the output of said polyphase rectifier has temporarily crossed a low threshold (LT), and control means for controlling the value of said low threshold (LT) as a function of the current magnitude at the output of said polyphase rectifier in such manner that the value of said low threshold (LT) decreases as the magnitude of said current increases.

2. The monitor defined in claim 1, comprising a monostable circuit triggered as a function of said temporary crossing and of which the time-constant is larger than the period of the voltage to be rectified by said polyphase rectifier.

3. The monitor defined in claim 2, comprising means integrating the value of the output signal of said monostable circuit and means comparing the magnitude of the output signal of said integration means with a high threshold, which triggers said alarm when said high threshold is crossed by the output signal of said integration means.

* * * * *